US006326838B1

(12) United States Patent
Kimura et al.

(10) Patent No.: US 6,326,838 B1
(45) Date of Patent: Dec. 4, 2001

(54) TIME SHARING ANALOG FILTERS CONTROL METHOD AND MAGNETIC DISK SYSTEM

(75) Inventors: Hiroshi Kimura, Kashiwa; Takushi Nishiya, Machida; Takatoshi Kato, Yokohama; Takashi Nara, Takasaki; Seiichi Mita, Shiroyama-machi, all of (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/389,582

(22) Filed: Sep. 3, 1999

(30) Foreign Application Priority Data

Sep. 7, 1998 (JP) .................................................. 10-252187

(51) Int. Cl.[7] ...................................................... H03B 1/00

(52) U.S. Cl. ........................................... 327/552; 327/558

(58) Field of Search .................................... 327/551, 552, 327/553, 558, 559; 330/303, 305, 306

(56) References Cited

U.S. PATENT DOCUMENTS

| 5,187,445 | * | 2/1993 | Jackson ................................ 330/109 |
| 5,534,819 | * | 7/1996 | Gunter et al. ........................ 327/553 |
| 5,572,163 | | 11/1996 | Kimura et al. ....................... 327/553 |
| 5,614,860 | * | 3/1997 | Osaki et al. ......................... 327/552 |
| 5,912,583 | * | 6/1999 | Pierson et al. ....................... 327/553 |

\* cited by examiner

Primary Examiner—Tuan T. Lam
(74) Attorney, Agent, or Firm—Mattingly, Stanger & Malur, P.C.

(57) ABSTRACT

A transconductance control circuit is composed of a replica transconductance amplifier and resistance, a reference voltage source, first selectors, a differential amplifier, a voltage-current translate circuit with characteristics equal to the transconductance amplifier which constitutes analog filters. A first switch of the first selectors is connectable for the reference voltage source, and every constant period is made to connect it using clocks at the reference voltage source. A second switch of second selectors is connectable for plural capacitors, and every constant period is made to connect it using clocks at the capacitors.

5 Claims, 10 Drawing Sheets

TIME SHARING ANALOG FILTERS CONTROL METHOD AND MAGNETIC DISK SYSTEM

BACKGROUND OF THE INVENTION

Especially, this invention concerns control method and magnetism disk system of filter property of analogue filters on the control method of analogue filters detailed description of the invention technology field which the invention belongs to.

Figure 2:
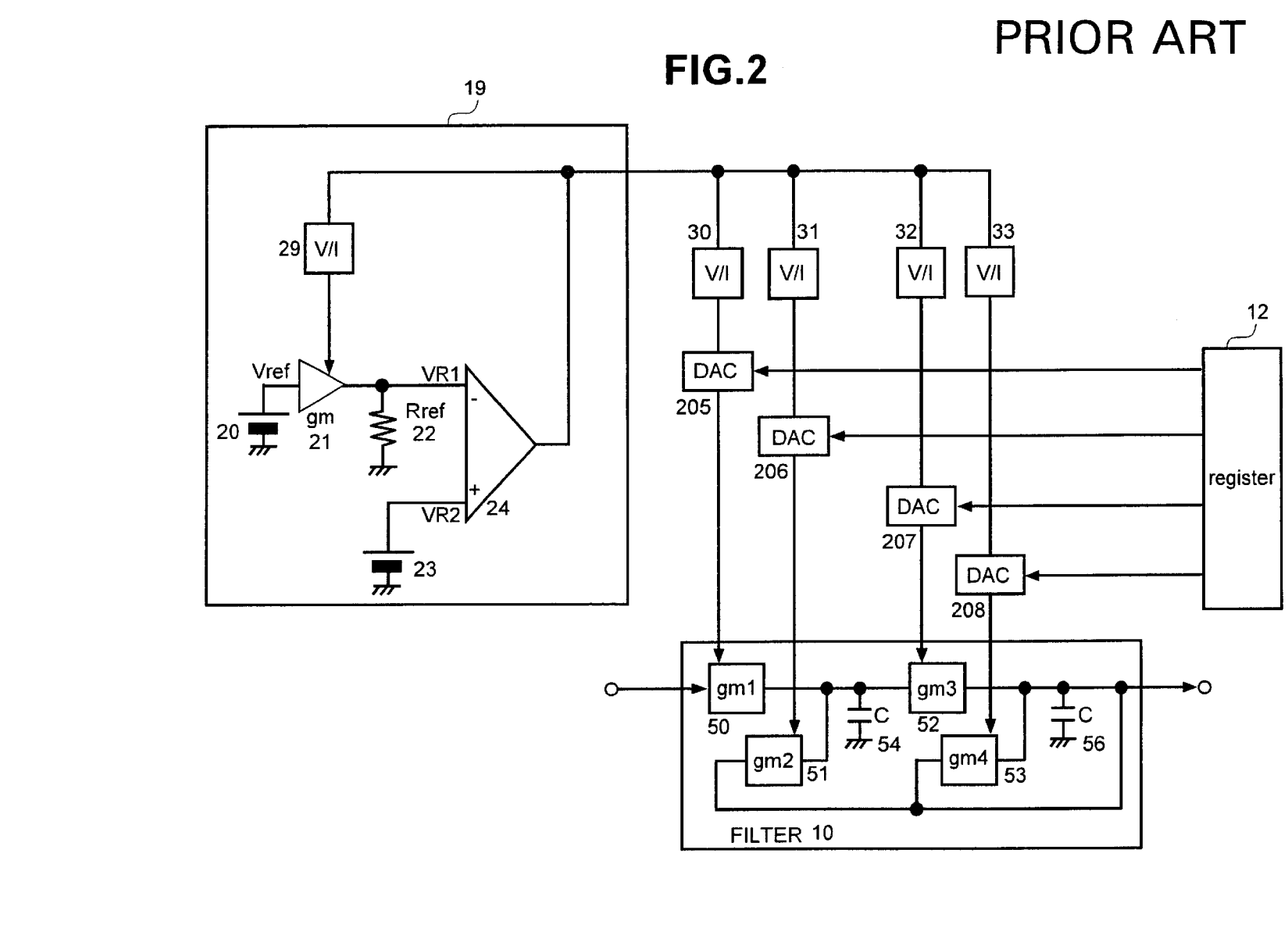
FIG. 2 is a block diagram of a convention analog filter control section.

The conventional technology is explained using FIG. 2 conventional technology. FIG. 2 showed analogue filters blocks, and it is composed of analogue filters of 10, transconductance control circuit of 19, digital to analog conversion vessel 205~208, registers of 12. And, analogue filters of 10 consist of transconductance amplifier 50~53, 54,56 capacity. Transconductance amplifier of 19 is composed of replica transconductance amplifier of 21, resistance of 22, reference voltage source 20,23, differential amplifier of 24, voltage-current translate circuit of 29. In the conventional filter control system of transconductance amplifier 50~53 which constitutes analogue filters of 10 by using digital analog converter circuit 205~208 in proportion to the value that it converted the reference voltage which was created in transconductance control circuit of 19 into the current at voltage-current translate circuit 30~33 and set in registers of 12 for this current. The lance conductance has been controlled. It seems to describe analogue filters control method at U.S. Pat. No. 5,572,163.

SUMMARY OF THE INVENTION

Figure 3:
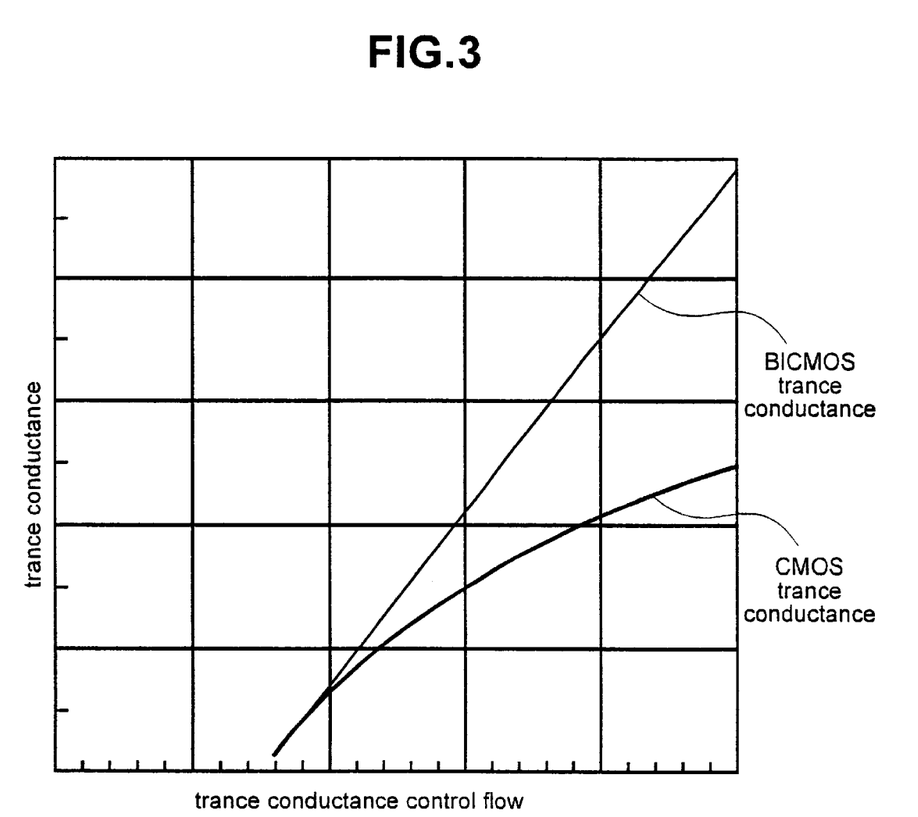
FIG. 3 graphs the relationship between transconductance and control current.

Transconductance amplifier which constituted analogue filters of 10 in the technology the superscription convention was made by the BiCMOS process the problem in which the invention intends to reach solution. The graph of the relation between control current and transconductance is shown in FIG. 3. The case in which the graph in composing the transconductance amplifier of the BiCMOS process was composed of 60 and CMOS process is shown in 61. The relation between transconductance and control current was linear, when the transconductance amplifier was composed of the BiCMOS. The relation between transconductance and control current becomes the nonlinearity like graphs of 61 of FIG. 3, when the transconductance amplifier was composed of CMOS. Therefore, it is difficult that it must put the ratio of the transconductance together so that the filter property may become fixed at digital analog converter circuit 205~208 of figure of 2, and that ratio accuracy of each transconductance takes it, and there is a problem that the filter property deteriorates. And, in case of the composition of FIG. 2, the digital analog converter circuit must be prepared in proportion to the type of transconductance value of the transconductance amplifier which constitutes analogue filters of 10, and there is a problem that circuit scale and consumption current increase.

Figure 1:
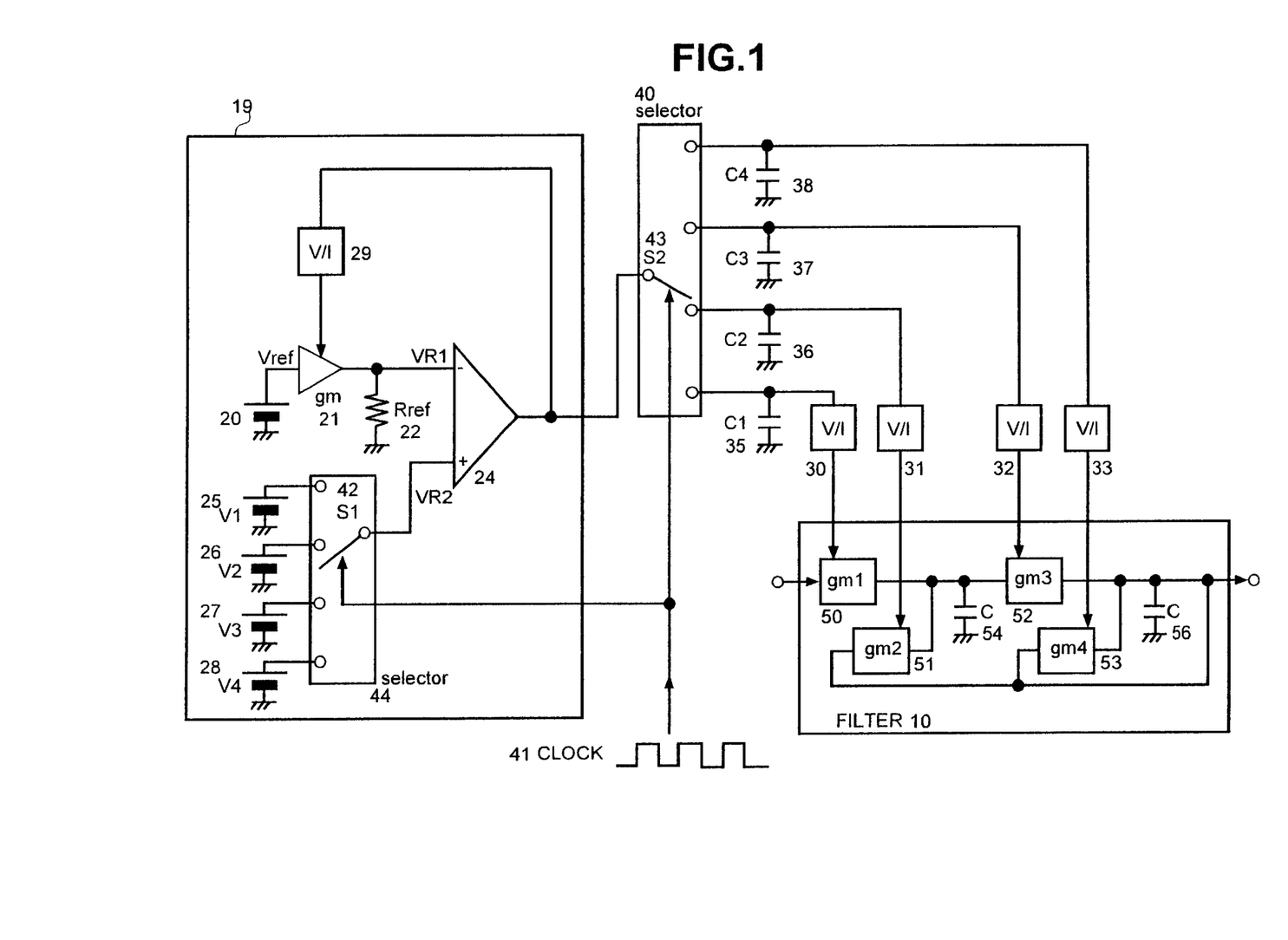
FIG. 1 shows a configuration of an analog filter control section according to the present invention.

As a means for solving the superscription problem, analogue filters control method by this invention is shown in figure of 1 means for solving the problem. Analogue filters control method shown for this invention shown in figure of 1 is composed of analogue filters of 10, transconductance control circuit of 19, selectors of 40, 35~38 capacity, voltage-current translate circuit 30~33, clocks of 41. Analogue filters of 10 are composed of transconductance amplifier 50~53, 54,56 capacity. Transconductance control circuit of 19 is composed of replica transconductance amplifier of 21 and resistance of 22, reference voltage source 20,25~28, selectors of 44, differential amplifier of 24, voltage-current translate circuit of 29 with characteristics equal to transconductance amplifier which constitutes analogue filters of 10. Switch of 42 of selectors of 44 is connectable for reference voltage source 25~28, and the every constant period is made to connect it using clocks of 41 at reference voltage source 25~28. Switch of 43 of selectors of 40 is connectable for the 35~38 capacity, and the every constant period is made to connect it using clocks of 41 at the 35~38 capacity. It is possible that by choosing such composition, reference voltage 25~28 are met in the every constant period, that the transconductance control circuit can output the transconductance control signal and that it respectively retains these transconductance control signal at the 35~38 capacity. It is possible to control the transconductance of the each transconductance amplifier high-precise by this. And, it is possible to reduce the digital analog converter circuit by taking the composition of this invention, and it becomes possible that circuit scale and power consumption are reduced.

DESCRIPTION OF THE PREFERRED EMBODIMENTS

Analogue filters control method of this invention shown in figure of 1 is composed of analogue filters of 10, transconductance control circuit of 19, selectors of 40, 35~38 capacity, voltage-current translate circuit 30~33, clocks of 41 form of the execution of the invention. Transconductance control circuit of 19 is composed of replica transconductance amplifier of 21 and resistance of 22, reference voltage source 20,25~28, selectors of 44, differential amplifier of 24, voltage-current translate circuit of 29 with characteristics equal to transconductance amplifier which constitutes analogue filters of 10. Switch of 42 of selectors of 44 is connectable for reference voltage source 25~28, and the every constant period is made to connect it using clocks of 41 at reference voltage source 25~28. Switch of 43 of selectors of 40 is connectable for the 35~38 capacity, and the every constant period is made to connect it using clocks of 41 at the 35~38 capacity. It is possible that reference voltage source 20,25~28 are realized by the bandgap potential circuit. It is to realize replica transconductance amplifier of 21 in transconductance amplifier which constitutes analogue filters of 10 and equal circuit structure on the identical chip, layout, and it is possible to give equal characteristics for temperatures, source voltages, circuit dispersion, etc. Resistance of 22 is the resistance which does not affect the temperature fluctuation at the outside attachment resistance. Gm and resistance value of external resistance of 22 are made to be Rref in respect of voltage value of reference voltage source of 20 in respect of Vref and transconductance of the replica transconductance amplifier. In this case, voltage value VR1 which resistance of 22 takes consists like following equations.

$$VR1 = Vref \times gm \times Rref \qquad (1)$$

Again, differential amplifier of 24 outputs the voltage which did gain and twice of input difference voltage (VR2−VR1), when the voltage value of the voltage generator chosen by switch of 42 is made to be VR2. Voltage-current translate circuit of 29 converts the output voltage of differential amplifier of 24 into the current, and transconductance gm of replica transconductance amplifier of 21 is controlled. By constituting such feedback loop, the control is taken so that input voltage (VR2−VR1) of differential amplifier of 24 may become 0. Then, following relation is established.

$$Vref \times gm \times Rref = VR2 \qquad (2)$$

$$gm = VR2 / (Vref \times Rref) \qquad (3)$$

Figure 4:
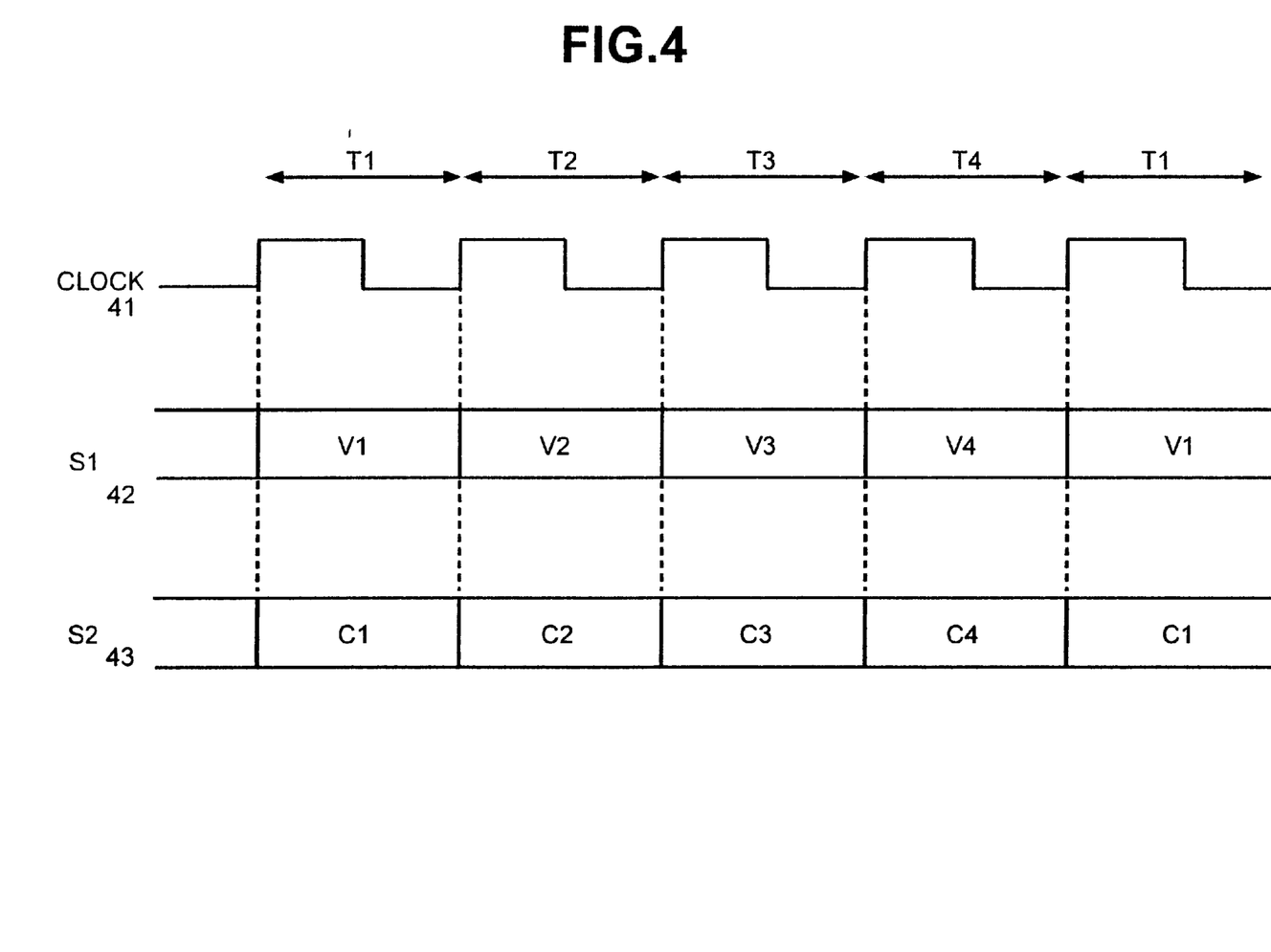
FIG. 4 shows the timing of a control clock.

Then, it becomes possible that transconductance gm of replicas transconductance amplifier of 21 is controlled using voltage value VR2 chosen by switch of 42 of selectors of 44. Again, using switch of 43 of selectors of 40, the output signal of differential amplifier of 24 is made to be the 35~38 capacity connectable like figure of 1, and the transconductance of transconductance amplifier 50~53 which constitutes analogue filters of 10 by converting the output voltage of differential amplifier of 24 into the current at voltage-current translate circuit 30~33, is controlled. By this, it is possible to control the transconductance of transconductance amplifier 50~53 which composes analogue filters of 10 of control voltage equal to the control voltage which controls replica transconductance amplifier of 21. By making this transconductance amplifier 50~53 and replica transconductance amplifier of 21 equal characteristics, it is possible to also similarly control the transconductance of transconductance amplifier 50~53 with equation (3). By choosing such composition, transconductance amplifier which constitutes analogue filters is possible to control like equation (3) high-precise without being dependent on the process. Again, it becomes possible that transconductance gm by equation (3) without the temperature dependence is realized by equalizing reference voltage source of 20 with characteristics of reference voltage source 25~28, and making resistance of 22 to be outside attachment resistance which does not depend on the temperature fluctuation. By the composition of the above, it becomes possible that the filter property of analogue filters of 10 is controlled high-precise. FIG. 4 showed switch of 43 of selectors of 40 shown in figure of 1, switch of 42 of selectors of 44 and timing of clocks of 41. By synchronizing in clocks of 41, switch of 42 is connected periodically at voltage generator 25~28. And, by synchronizing like the figure in clocks of 41, switch of 43 would be connected periodically to the 35~38 capacity. By controlling selectors of 40 in such timing, it consists with VR2=Vi(i=1~4) in period Ti(i=1~4), and the transconductance of replica transconductance of 21 consists of equation (3) like the following equation.

$$Gm = Vi / (Vref \times Rref) \quad (i=1{\sim}4) \qquad (4)$$

The output voltage of the differential amplifier of each period Ti(i=1~4) is retained by selectors of 40 at the Ci(i=1~4)35~38 capacity. Transconductance amplifier 50~53 which constitute filter of 10 through voltage-current translate circuit 30~33 are controlled in respect of the voltage retained at this 35~38 capacity. By this, the (4) style can similarly show it like the following each transconductance gmi(i=1~4).

$$Gmi = Vi / (Vref \times Rref) (i=1{\sim}4) \qquad (5)$$

Figure 5:
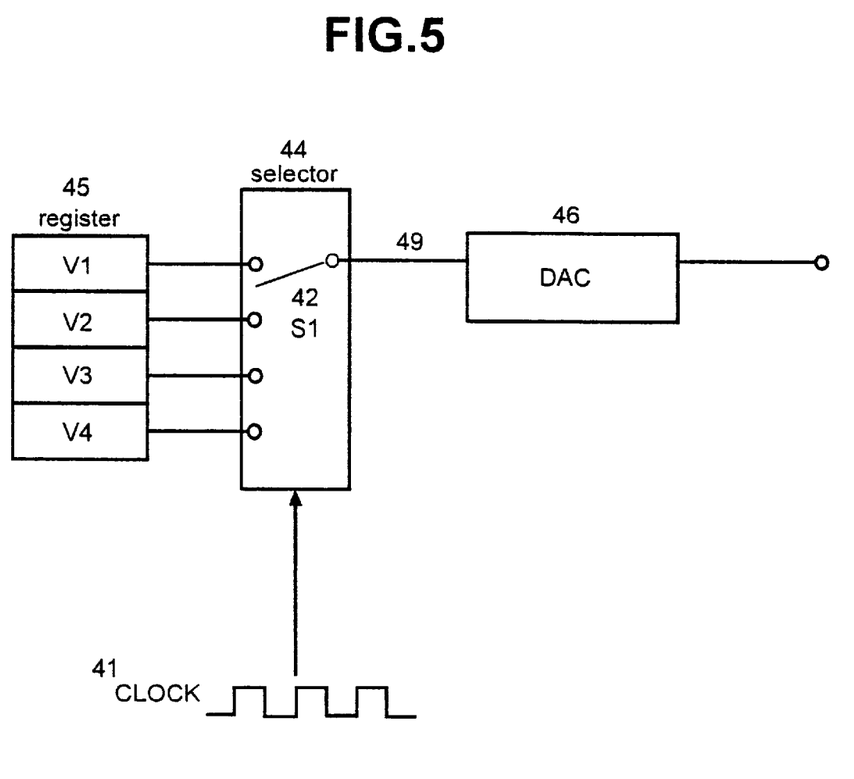
FIG. 5 illustrates the circuit structure of a selector and a voltage generator.
Figure 6:
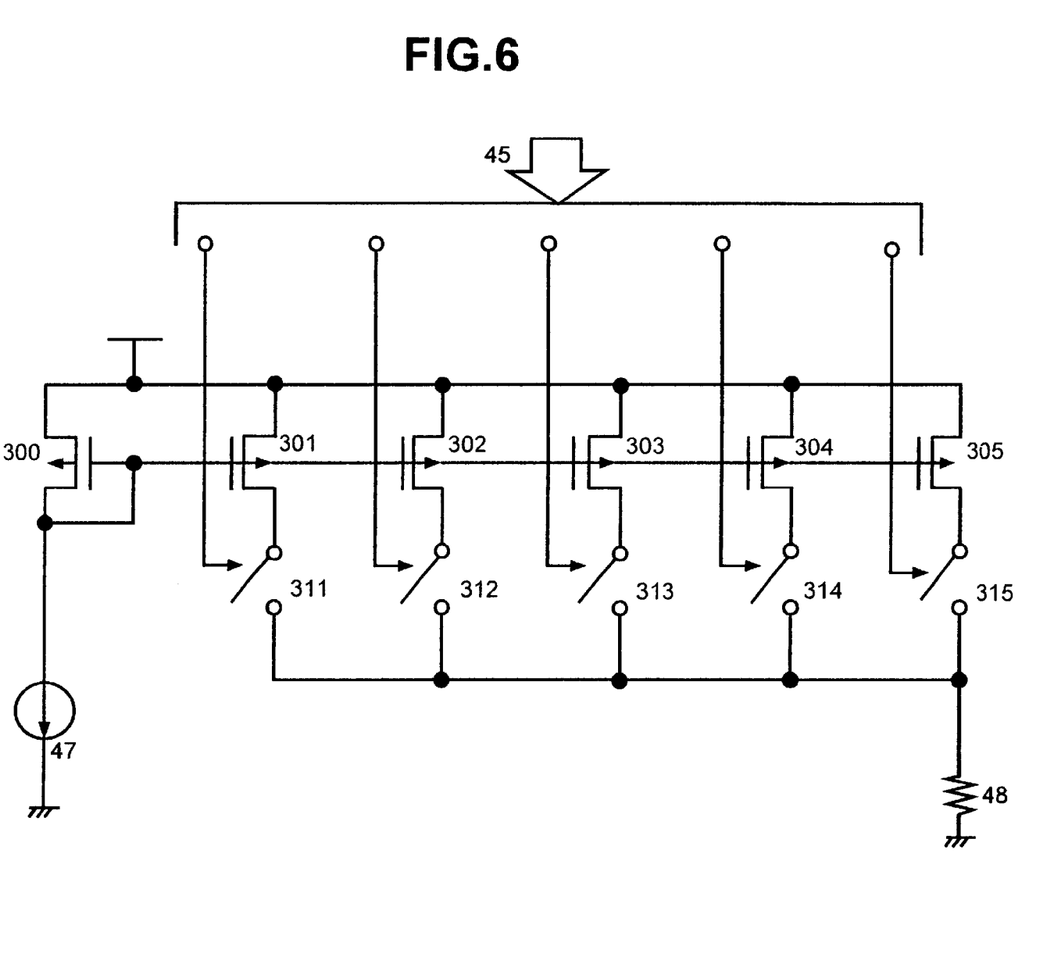
FIG. 6 shows a digital-analog converter.
Figure 7:
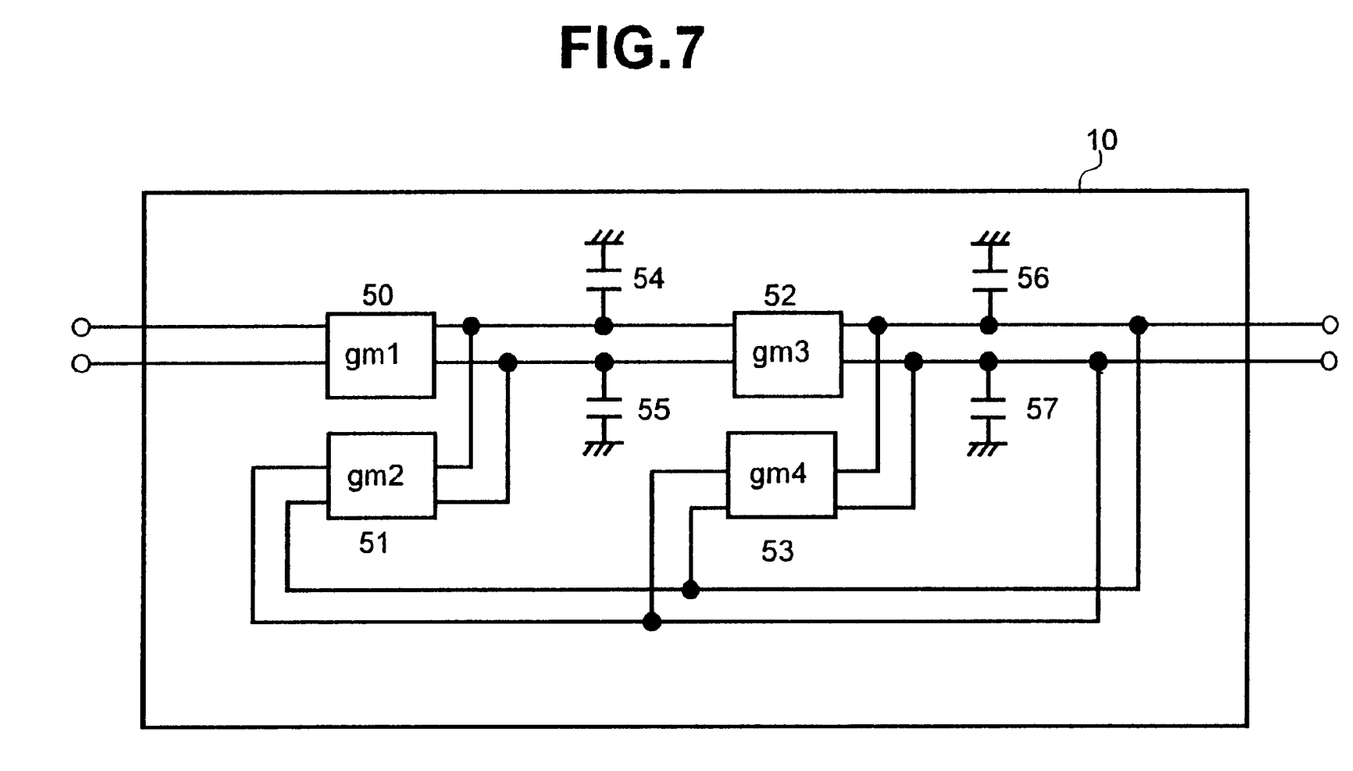
FIG. 7 shows a configuration of analog filters.

FIG. 5 shows voltage generator 25~28 of figure of 1 and circuit structure example of selectors of 44. Voltage value in proportion to voltage generator 25~28 is recorded in registers of 45 as digital data, and digital data of register of 45 are connected using switch of 42 in selectors of 44 for the input of digital to analog conversion vessel. Digital to analog conversion vessel 46 output the voltage in proportion to voltage value chosen by switch of 42. It synchronizes in clocks of 41, and the switch of selectors of 44 is connected periodically for voltage value V1~V4 of registers of 45. FIG. 6 showed the circuit structure of figure of 5 of digital to analog conversion vessels 46. Digital to analog conversion vessel of 46 is composed of PMOS transistor 300~305, current sources of 47, switch 311~315 and resistance of 48. PMOS transistor 300~305 constitutes the current loop circuit, and the drain current of PMOS transistor 301~305 is controlled in proportion to the value of registers of 45 by switch 311~315. The sum of drain current chosen at switch 311~315 is converted into the output voltage by resistance of 48. FIG. 7 shows the configuration example of analogue filters of 10. Analogue filters of 10 consist of transconductance amplifier 50,51,52,53, 54,55,56,57 capacity, and the secondary lowpass filter is constituted. The capacity value of gm1, gm2, gm3, gm4 and 54,55,56,57 capacity is made to be C in respect of each transconductance of transconductance amplifier 50,51,52,53. The transfer function of this filter is shown like equation (6).

Figure 8:
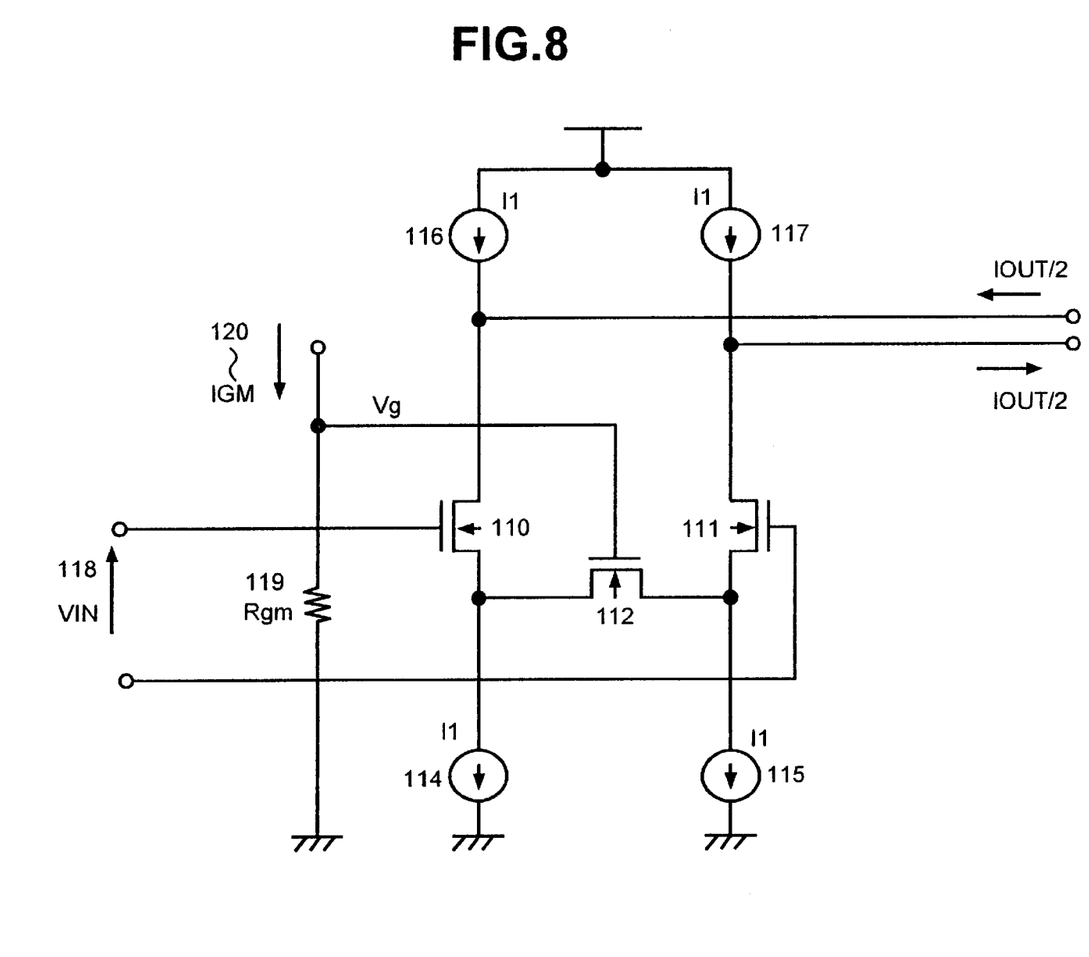
FIG. 8 shows an example of a CMOS transconductance amplifier circuit structure.

Cut-off frequency and Q0 of secondary lowpass filter show the gain here on w0 on Q-value and A of the filter. And, it is possible to control Q-value of the filter, while w0 cut-off frequency and gain A were fixed by controlling gm4 from equation (6). FIG. 8 showed circuit structure example of the CMOS transconductance amplifier. This transconductance amplifier has been composed of resistance of 119 which functions as NMOS transistor 110111,112, current source 114115,116117 and current-voltage conversion. The gate of NMOS transistor 110111 gives 118 input signals of this transconductance amplifier, and output current IOUT is output from the drain of NMOS transistor 110111. Resistance component rs by NMOS transistor 110111 is decided by I1 current value of current source 114115. And, on-resistance ron of NMOS transistor of 112 is decided in voltage Vg which is charged on the gate of NMOS transistor of 112. Voltage Vg is decided from current value Igm of control currents of 120 and resistance value Rgm of resistance of 119 by following equations. Gm is shown in equation (8), when the transconductance of this circuit for differential input signal of 118 is made to be gm $$Vg = Igm \times Rgm \qquad (7).$$

$$Gm = 1/(ron + rs) \qquad (8)$$

Figure 9:
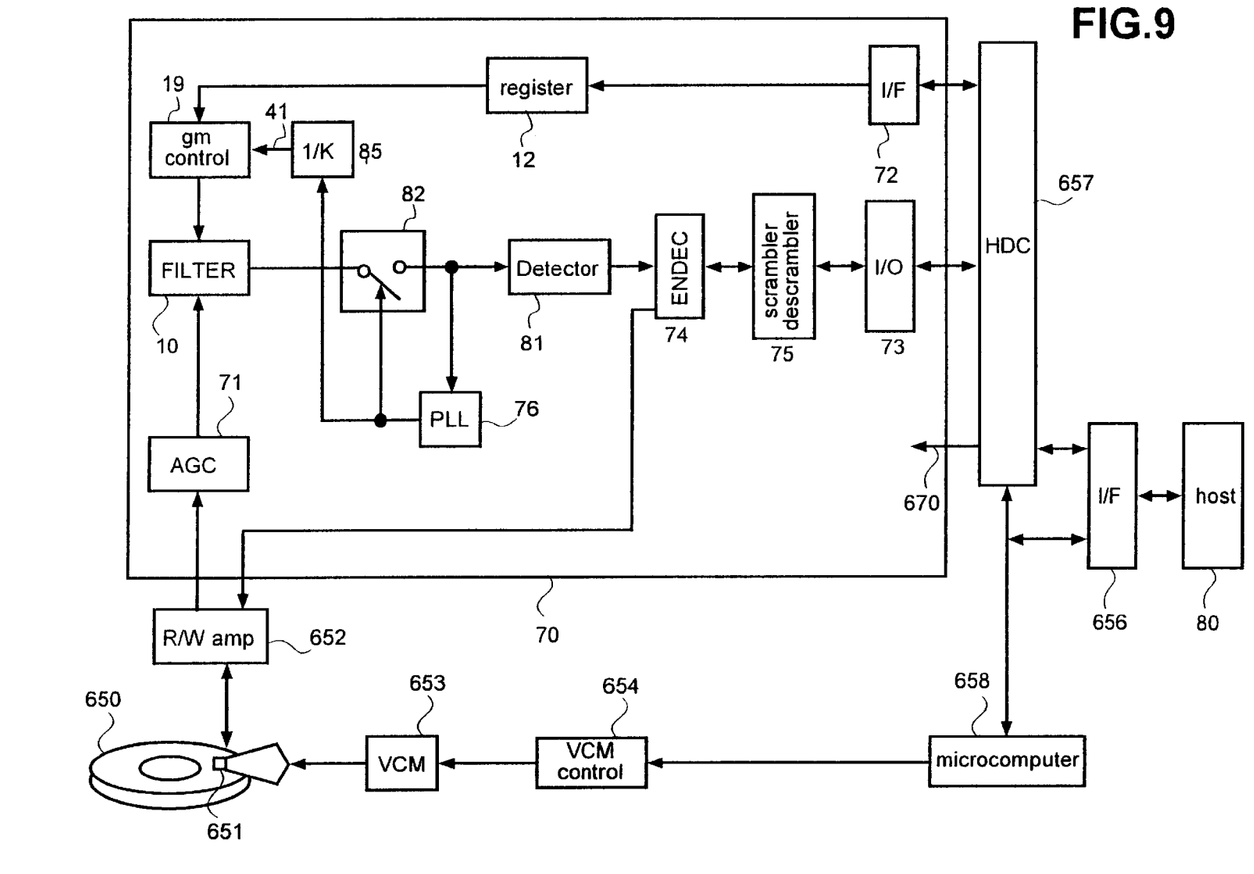
FIG. 9 shows a magnetic disk recording/reproducing system.
Figure 10:
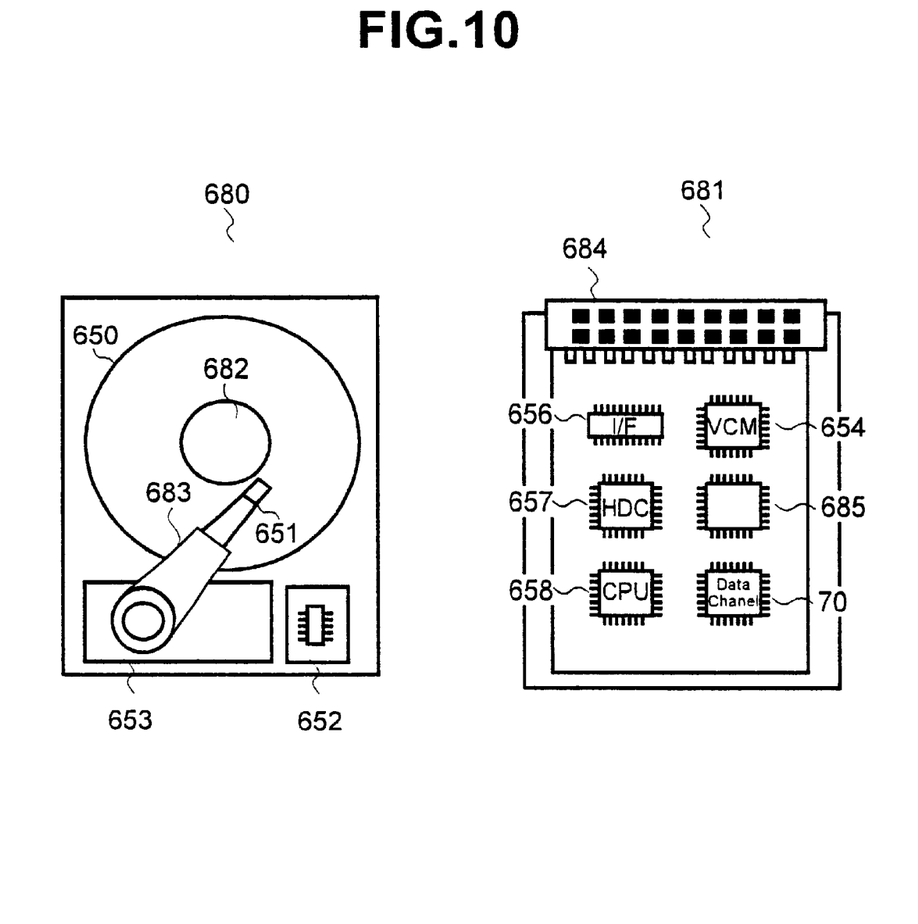
FIG. 10 shows a magnetic disk recording/reproducing system employing an analog filter control system according to the present invention.

It becomes possible that transconductance gm is controlled by controlling ron here in control currents of 120. Though it is possible by increasing I1 current value of current source 114115, in order to make rs small in the CMOS transistor, it is not actual, when the power consumption was considered. Therefore, the relation between control currents of 120 transconductance gm becomes the relation which is nonlinear like graphs of 61 of FIG. 3. FIG. 9 shows system constitution figure of the magnetic disk. The data written in magnetic disk of 650 is read out in magnetic heads of 651, and it is amplified in read light amplifier of 652. The output signal of read light amplifier of 652 is processed in signal processing circuit of 70, and the data is reproduced, and hard disk controllers of 657 send it. Then, hosts of 80 sends it through interfaces of 656. And, voice coil motors of 653 are controlled by voice coil motor control circuit of 654, microcomputers of 658. By lead gate of 670 in which signal processing circuit of 70 is readout order from hard disk controllers of 657, the readout signal processing is carried out. The output signal of read light amplifier of 652 is amplified in order to become constant amplitude in AGC amplifier of 71, and noise rejection, waveform equalization are carried out in analogue filters of 10, and it is sampled in sample-hold circuits of 82. Sampled signal is detected in data detector of 81 in the data, and it is decoded in encoder/decoder of 74, and hard disk controllers of 657 send it through scrambler/descrambler circuit of 75, input/output circuit of 73. The sample is done sample-hold circuits of 82 by timing clock formed at PLL76. On analogue filters control system of this invention, transconductance control circuit of 19 is connected in analogue filters of 10, and the filter property of analogue filters of 10 is controlled in registers of 12. And, it is possible to do reading and writing of the data of registers of 12 from the hard disk controller through serial interfaces of 72. Clocks of 41 used by the transconductance control circuit uses the clock as a low frequency in dividing stage of 85 in respect of timing clock formed at PLL76. In the record of the data, hard disk controllers of 657 send the writing data, and scrambler/descrambler circuit of 75 is passed through input/output circuit of 73, it is written, and the data is made to be the pseudorandom data, and the encoding is done in encoder/decoder of 74, it is written through read light amplifier of 652. FIG. 10 shows the magnetic disk unit using analogue filters control system of this invention. Magnetic disk of 650 that the data has been written, spindle motor of 682 which rotates disk of 650, heads of 651 for the readout of the data from disk of 650, arms of 683 which supports heads of 651, voice coil motors of 653 for moving head of 651, signal from heads of 651 magnetic disk unit inside of 680. It consists of amplifying read light amplifier 652. And, analogue filters control of interfaces of 684 for connecting with the information processing equipment of hosts, etc., interface control circuit of 656 which controls an input/output of interfaces of 684, delivery of the data and hard disk controllers of 657 which controls formats, etc., microcomputers of 658, this invention magnetic disk unit electronic circuit division of 681. The system is contained, and it consists of voice coil motor control circuit of 654 which controls signal processing circuit of 70 which processes signal from read light amplifier of 652, spindle control circuit of 685 for controlling spindle motor of 682, voice coil motors of 653. According to this invention, it is possible to control the transconductance of each transconductance amplifier which constitutes analogue filters high-precise effect of the invention. By this, it becomes possible that the filter property is also controlled high-precise. And, it is possible to reduce the digital analog converter circuit by taking the composition of this invention, and it becomes possible that circuit scale and power consumption are reduced.

What is claimed is:

1. A signal processing circuit, comprising:
    an analog filter including a plurality of variable transconductance amplifiers and a plurality of capacitors; and
    a filter property control unit including:
        a transconductance control circuit which outputs a control signal which controls said plurality of variable transconductance amplifiers;
        a plurality of capacitors, connected between said filter property control circuit and said analog filter;
        a selector, connected between said transconductance control circuit and said plurality of capacitors of; and
        a plurality of voltage-current translate circuits, connected between said plurality of capacitors of and said analog filter, which translates a voltage held in said plurality of capacitors of into a current which controls said analog filter;
    wherein said selector selects one of said plurality coupled to said control signal in accordance with an external clock.

2. A signal processing circuit according to claim 1, wherein said transconductance control circuit further comprises:
    a replica transconductance amplifier which is constructed of the same LSIs as said transconductance amplifiers and which outputs said control signal;
    a reference voltage generator connected to said replica transconductance amplifier;
    a variable reference voltage generator which outputs a variable voltage in a constant period;
    a resistor connected to said replica transconductance amplifier; and
    an amplifier connected to said reference voltage generator.

3. A signal processing circuit according to claim 2, wherein said variable voltage generator further comprises:
    a digital-analog converter;
    a plurality of registers which hold a value of voltage; and
    a switch connected between said digital-analog converter and said plurality of registers;
    wherein said switch selects one of said plurality of registers in accordance with said external clock.

4. A signal processing circuit according to claim 3, wherein said signal processing circuit is composed of a one-chip LSI.

5. A magnetic disk apparatus, comprising:
    a magnetic disk;
    a head which picks up a signal recorded in said magnetic disk;
    a read/write amplifier which amplifies said signal;
    a clock generator;
    a signal processing circuit which processes said signal; and
    an interface connected to an external device;
    wherein said signal processing circuit includes:
        an analog filter including a plurality of variable transconductance amplifiers and a plurality of capacitors; and
        a filter property control unit including:
            a transconductance control circuit which outputs a control signal which controls said plurality of variable transconductance amplifiers for a constant period;
            a plurality of capacitors, connected between said filter property control circuit and said analog filter;
            a selector, connected between said transconductance control circuit and said plurality of capacitors; and
            a plurality of voltage-current translate circuits, connected between said plurality of capacitors and said analog filter, which translates a voltage held in said plurality of capacitors into a current which controls said analog filter;
    wherein said selector selects one of said plurality of capacitors coupled to said control signal in accordance with an output of said clock generator.

* * * * *